United States Patent
Manna et al.

(10) Patent No.: US 6,936,895 B2
(45) Date of Patent: Aug. 30, 2005

(54) ESD PROTECTION DEVICE

(75) Inventors: Indrajit Manna, Singapore (SG); Keng Foo Lo, Singapore (SG); Pee Ya Tan, Singapore (SG); Raymond Filippi, Singapore (SG)

(73) Assignees: Chartered Semiconductor Manufacturing Ltd., Singapore (SG); Agilent Technologies, Inc., Santa Clara, CA (US)

( * ) Notice: Subject to any disclaimer, the term of this patent is extended or adjusted under 35 U.S.C. 154(b) by 26 days.

(21) Appl. No.: 10/682,055

(22) Filed: Oct. 9, 2003

(65) Prior Publication Data

US 2005/0077577 A1 Apr. 14, 2005

(51) Int. Cl.[7] ............ H01L 23/62; H01L 21/425; H01L 21/8234; H01L 31/075
(52) U.S. Cl. ............ 257/355; 438/237; 438/514; 438/517; 438/527; 257/656
(58) Field of Search ............... 438/237, 514, 438/517, 519, 527; 257/355, 656

(56) References Cited

U.S. PATENT DOCUMENTS

| | | | |
|---|---|---|---|
| 4,841,349 A | * | 6/1989 | Nakano .................. 257/75 |
| 5,610,409 A | * | 3/1997 | Leas et al. .............. 257/59 |
| 5,920,091 A | * | 7/1999 | Lin ....................... 257/290 |
| 5,969,561 A | * | 10/1999 | McGillan ............... 327/308 |
| 6,259,134 B1 | | 7/2001 | Amaratunga et al. ..... 257/330 |
| 6,304,484 B1 | * | 10/2001 | Shin et al. ............. 365/185.03 |
| 2002/0066929 A1 | | 6/2002 | Voldman et al. ....... 257/355 |
| 2002/0070388 A1 | * | 6/2002 | Greenberg et al. ..... 257/122 |
| 2002/0088978 A1 | | 7/2002 | Trainor et al. ......... 257/72 |

OTHER PUBLICATIONS

Standard reference by S.M. Sze, *Physics of Semiconductor Devices*, Second Ed., John Wiley & Sons, Copyright 1981, pp. 570–577.

* cited by examiner

Primary Examiner—Erik Kielin
Assistant Examiner—Heather A. Doty
(74) Attorney, Agent, or Firm—George O. Saile; Stephen B. Ackerman; Douglas R. Schnabel

(57) ABSTRACT

A new method to form an integrated circuit device is achieved. The method comprises forming a dielectric layer overlying a semiconductor substrate. An intrinsic semiconductor layer is formed overlying the dielectric layer. The intrinsic semiconductor layer is patterned. A p+ region is formed in the intrinsic semiconductor layer. An n+ region is formed in the intrinsic semiconductor layer. The p+ region and said n+ region are laterally separated by an intrinsic region to thereby form a PIN diode device. A source region and a drain region are formed in the semiconductor substrate to thereby complete a MOSFET device. The PIN diode device is a gate electrode for the MOSFET device.

33 Claims, 6 Drawing Sheets

ESD PROTECTION DEVICE

BACKGROUND OF THE INVENTION (1) Field of the Invention

The invention relates to an integrated circuit device and, more particularly, to a device for protecting an integrated circuit from electrostatic discharge.

(2) Description of the Prior Art

Designing electrostatic discharge (ESD) protection structures for high-speed analog or radio frequency (RF) applications presents many challenges. These challenges are due to the stringent requirements for low input impedance and to the need to keep the area of the input protection devices to a minimum. Referring now to FIG. 1, a prior art ESD protection circuit is shown. In this traditional approach, a grounded gate NMOS (GGNMOS) device 10 is used. The gate of the device is connected to the grounded pin or pad 18. During an ESD event on the input pin 14, the parasitic bipolar device formed by the source, bulk, and drain (n-p-n) conducts current away from the input pin 14 to the ground pin 18 due to reverse junction breakdown and secondary breakdown. The traditional GGNMOS device 10 has proven quite useful over the years. However, the device 10 must be made quite large to dissipate the ESD energy without device failure. It is found that the GGNMOS device 10 adds too much parasitic capacitance to the input pin 14. This, in turn, degrades the analog performance of the pin 14. In addition, it is found that the secondary breakdown, or snap-back, performance of the GGNMOS device 10 is degraded in state of the art CMOS technologies. Due to this degradation, the device 10 must be made even larger to accommodate the ESD energy. Again, the capacitance of the device increases due to the increase in the drain area coupled to the pin 14.

Referring now to FIG. 2, various techniques have been proposed to improve the turn-ON characteristics of the NMOS protection device 22. One such approach is called gate coupling. In a gate coupled NMOS (GCNMOS) device 22, the gate is not connected to ground directly. Rather, the gate is coupled to a control circuit 26 and 30. In this example, the gate of the NMOS is coupled to a RC network comprising a capacitor C 26 and a resistor R 30. During normal operation, the gate is discharged to the ground pin 38 through R 30. During the ESD event, the capacitor C 26 couples a larger voltage onto the gate than would occur without the capacitor. This gate coupling improves the turn-ON characteristic of the device 22. However, the capacitor C 26 and resistor R 30 network increases the area of the device.

Referring now to FIG. 3, a second prior art approach to improving the performance of the NMOS device 42 is shown. In this case, the bulk, or substrate, of the device 42 is biased using a substrate bias generator 54. The substrate bias generating circuit 54 also improves the turn-ON characteristic of the NMOS device 42, but this improvement requires substantial area and increases the capacitance at the input node 46.

Several prior art inventions relate to PIN diode devices and to ESD. U.S. Pat. No. 6,259,134 B1 to Amarantunga et al describes an MOS-controllable, power semiconductor trench device. The device comprises a PIN diode in parallel with a thyristor. U.S. Application 2002/0066929 A1 to Voldman discloses an ESD power clamping circuit comprising a FET and a bipolar element. In one embodiment, a diode, or a series of diodes, is coupled to the gate of the FET. The diode may comprise a PIN diode. U.S. Application 2002/0088978 A1 to Trainor et al shows an active matrix device where a pair of opposing, lateral PIN diodes is used to provide ESD protection across the row and column lines.

SUMMARY OF THE INVENTION

A principal object of the present invention is to provide an effective and very manufacturable integrated circuit device.

A further object of the present invention is to provide an integrated circuit device useful for protecting an input pin from an ESD event.

A yet further object of the present invention is to provide a device having excellent ESD performance in a state of the art CMOS process without requiring a large area or adding excessive parasitic capacitance.

A yet further object of the present invention is to provide a device that can be used in multiple configurations.

A yet further object of the present invention is to provide a method to form such a device that is very manufacturable and is very compatible with a state of the art CMOS process.

In accordance with the objects of this invention, a method to form an integrated circuit device is achieved. The method comprises forming a dielectric layer overlying a semiconductor substrate. An intrinsic semiconductor layer is formed overlying the dielectric layer. The intrinsic semiconductor layer is patterned. A p+ region is formed in the intrinsic semiconductor layer. An n+ region is formed in the intrinsic semiconductor layer. The p+ region and the n+ region are laterally separated by an intrinsic region to thereby form a PIN diode device. A source region and a drain region are formed in the semiconductor substrate to thereby complete a MOSFET device. The PIN diode device is a gate electrode for the MOSFET device.

Also in accordance with the objects of this invention, an integrated circuit device is achieved. The device comprises a dielectric layer overlying a semiconductor substrate. A PIN diode device overlies the dielectric layer. The PIN diode device comprises a semiconductor layer having a p+ region and an n+ region that are laterally separated by an intrinsic region. A MOSFET device comprises a source region and a drain region in the semiconductor substrate. The PIN diode device is a gate electrode for the MOSFET device.

Also in accordance with the objects of this invention, an ESD protection device is achieved. The device comprises a dielectric layer overlying a semiconductor substrate. A PIN diode device overlies the dielectric layer. The PIN diode device comprises a semiconductor layer having a p+ region and an n+ region that are laterally separated by an intrinsic region. A MOSFET device comprises a source region and a drain region in the semiconductor substrate. The PIN diode device is a gate electrode for the MOSFET device. The source region and the p+ region are connected together to form a first terminal. The drain region and the n+ region are connected together to form a second terminal.

Also in accordance with the objects of this invention, an ESD protection device is achieved. The device comprises a dielectric layer overlying a semiconductor substrate. A PIN diode device overlies the dielectric layer. The PIN diode device comprises a semiconductor layer having a p+ region and an n+ region that are laterally separated by an intrinsic region. A MOSFET device comprises a source region and a drain region in the semiconductor substrate. The PIN diode device is a gate electrode for the MOSFET device. The p+ region is a first terminal. The source region and the n+ region are connected together. The drain region forms a second terminal.

Also in accordance with the objects of this invention, an ESD protection device is achieved. The device comprises a dielectric layer overlying a semiconductor substrate. A plurality of PIN diode devices overlies the dielectric layer. Each PIN diode device comprises a semiconductor layer having a p+ region and an n+ region that are laterally separated by an intrinsic region. The PIN diode devices are in series. A MOSFET device comprises a source region and a drain region in the semiconductor substrate. The PIN diode device is a gate electrode for the MOSFET device. The drain region and the p+ of a first PIN diode device are connected together to form a first terminal. The source region and the n+ region of a second PIN diode device are connected together to form a second terminal.

BRIEF DESCRIPTION OF THE DRAWINGS

In the accompanying drawings forming a material part of this description, there is shown.

DESCRIPTION OF THE PREFERRED EMBODIMENTS

Figure 1:
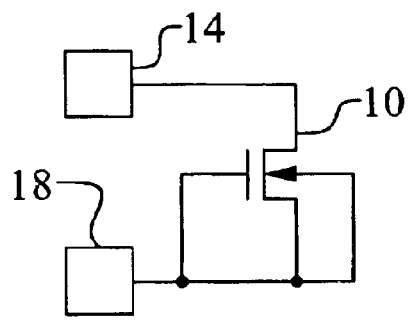
FIG. 1 illustrates a prior art grounded gate NMOS (GGNMOS) device used for ESD protection.
Figure 2:
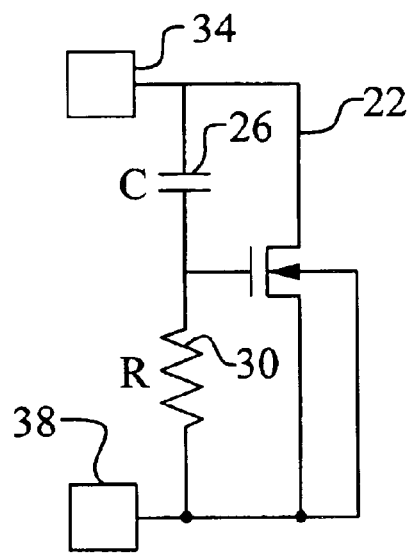
FIG. 2 illustrates a prior art gate coupled NMOS (GCNMOS) device using a RC chain to control the gate potential of the ESD protection device.
Figure 3:
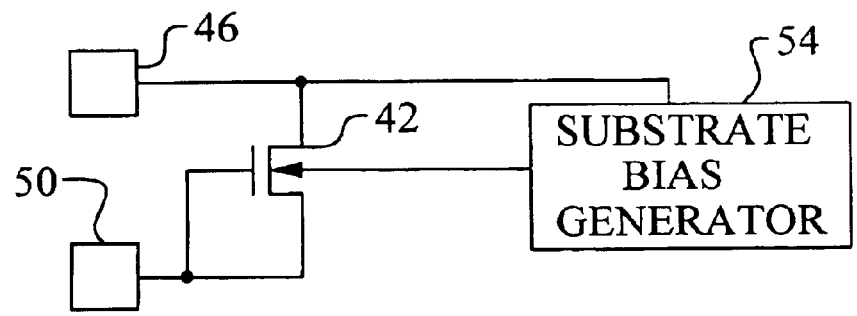
FIG. 3 illustrates a prior art GGNMOS ESD protection device with a substrate bias generator.
Figure 4:
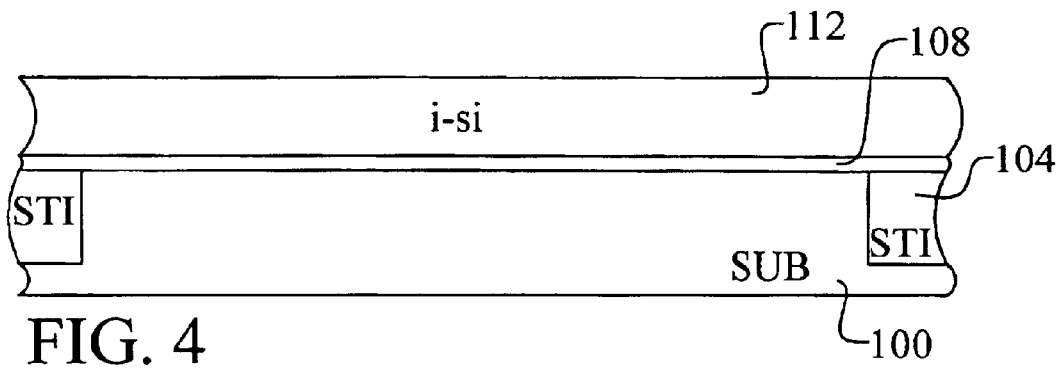
FIGS. 4 through 10 illustrate a preferred embodiment of the present invention showing a method to form a PIN diode gated, MOSFET device and showing the preferred embodiment of that device.

The preferred embodiments of the present invention disclose a novel integrated circuit device and a method to manufacture this a device. The device is called a PIN diode gated, MOSFET. This new device is particularly useful as an ESD protection device. Two methods for using this device for ESD protection are disclosed. It should be clear to those experienced in the art that the present invention can be applied and extended without deviating from the scope of the present invention.

Referring now to FIGS. 4 through 10, the preferred embodiment of the present invention is illustrated, and, more particularly, the preferred method to form a PIN diode gated, MOSFET device is illustrated. Several important features of the present invention are shown herein and are discussed below. This embodiment discloses a method to form a PIN diode gated, MOSFET device. In particular, an NMOS device is illustrated. However, the types of the various doped regions could be altered to create a PMOS device with a PIN diode gate as will be clear to those skilled in the art.

A semiconductor substrate 100 is provided. Any semiconductor material suitable to the formation of a MOSFET device may be used. In the preferred embodiment, the semiconductor substrate 100 comprises monocrystalline silicon. The substrate 100 may further comprise buried regions, or layers, as would be the case if a silicon on insulator (SOI) substrate is used. In the preferred embodiment, a p-type silicon substrate 100 with resistivity between about 6 and 9 ohm-cm is used. Note that isolation regions 104 may be formed in the semiconductor substrate 100 to define the active region for the device.

A dielectric layer 108 is formed overlying the surface of the semiconductor substrate 100 as shown. This dielectric layer 108 should be of suitable quality for use as the gate dielectric layer for a MOSFET device. The dielectric layer 108 should also be of suitable thickness and parametric capability for application to a device that is connected to an input/output (I/O) pin of an integrated circuit device that may be subjected to large voltages. The dielectric layer 108 preferably comprises an oxide material such as silicon oxide. However, other dielectrics, including metal oxides, nitrides, or oxynitrides, could be used. The dielectric layer 108 may be formed using any of the well-known techniques in the art, such as thermal oxidation or chemical vapor deposition. The dielectric layer 108 may be used in other parts of the integrated circuit device as a gate dielectric for other MOSFET devices including those used for logic or analog circuits. In this case, the formation of the dielectric layer 108 is a "free" process step for the present invention. In the preferred embodiment, the dielectric layer 108 comprises silicon oxide that is thermally grown to a thickness of between about 30 Å and 100 Å.

As an important feature of the present invention, an intrinsic ($\iota$) semiconductor layer 112 is formed overlying the dielectric layer 108. Preferably the intrinsic semiconductor layer 112 comprises silicon, however, other semiconductor materials could be used. If the intrinsic semiconductor layer 112 is silicon, then this layer may comprise polysilicon or amorphous silicon $\alpha$-silicon). Polysilicon or $\alpha$-silicon may be deposited by a chemical vapor deposition (CVD) process. If the intrinsic semiconductor layer 112 comprises polysilicon, and that is preferred, then it is more preferred that this polysilicon layer correspond to a polysilicon layer required in another section of the integrated circuit device. For example, the intrinsic semiconductor layer 112 may correspond to the initially deposited polysilicon layer for logic gates or for analog gates. In this case, the formation of the intrinsic semiconductor layer 112 is a "free" process step for the present invention.

It is important to note that the semiconductor layer 112 is intrinsic ($\iota$). Intrinsic is herein defined as a semiconductor with a very low, or zero, doping. More preferably, the intrinsic semiconductor layer 112 should have a resistivity of between about 1 and 3 k$\Omega$/square of material. This high resistivity is, needed to form a p-i-n (PIN) diode in the intrinsic semiconductor layer 112 in the subsequent processing. If the intrinsic semiconductor layer 112 is a polysilicon layer, then the polysilicon layer should be deposited as undoped polysilicon. The intrinsic semiconductor layer 112 is preferably formed to a thickness of between about 1,500 Å and 2,000 Å. Note that the thickness of the intrinsic semiconductor layer 112 can be important since ESD current is conducted through this layer 112 and since silicide, if used, is not be formed overlying all of the PIN diode device that is formed in the layer 112. Therefore, to provide a large current capability without excessive heating, it may be necessary to make the intrinsic semiconductor layer substantially thicker than a normal polysilicon gate is some technologies.

Figure 5:
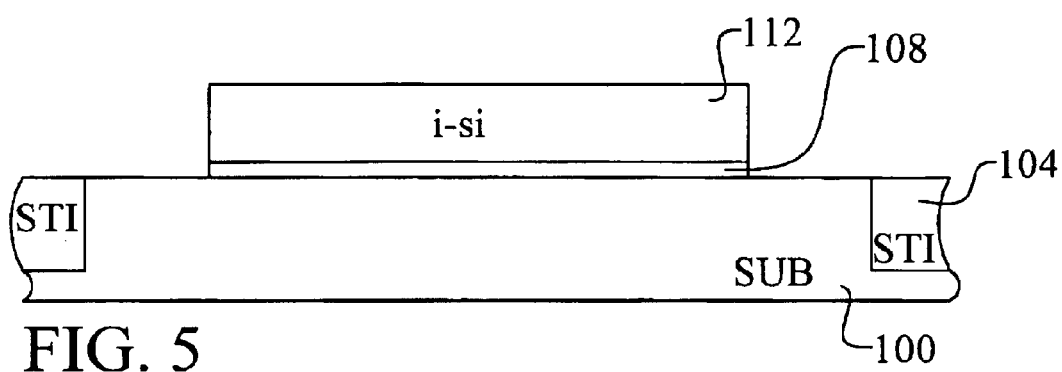

Referring now to FIG. 5, the intrinsic semiconductor layer 112 is patterned. This patterning step is preferably performed using a photolithography-etch sequence as is well known in the art. For example, a photosensitive film, not shown, is deposited overlying the intrinsic semiconductor layer 112. This photosensitive film is then exposed to actinic light through a photo mask. The photosensitive film is then developed to define the desired pattern. The photosensitive film is then used to mask an etching process where the intrinsic semiconductor layer 112 is etched away where exposed by the photosensitive film. Finally, the photosensitive film is stripped away to reveal the patterned intrinsic semiconductor layer 112. Alternative methods of patterning may be used and are not essential to teachings of the present invention. In the preferred embodiment, the intrinsic semiconductor layer 112 comprises polysilicon and is patterned during the patterning step used to define polysilicon gates in another section of the integrated circuit device. In this case, the patterning of the intrinsic semiconductor layer 112 is a "free" process step for the present invention.

Figure 6:
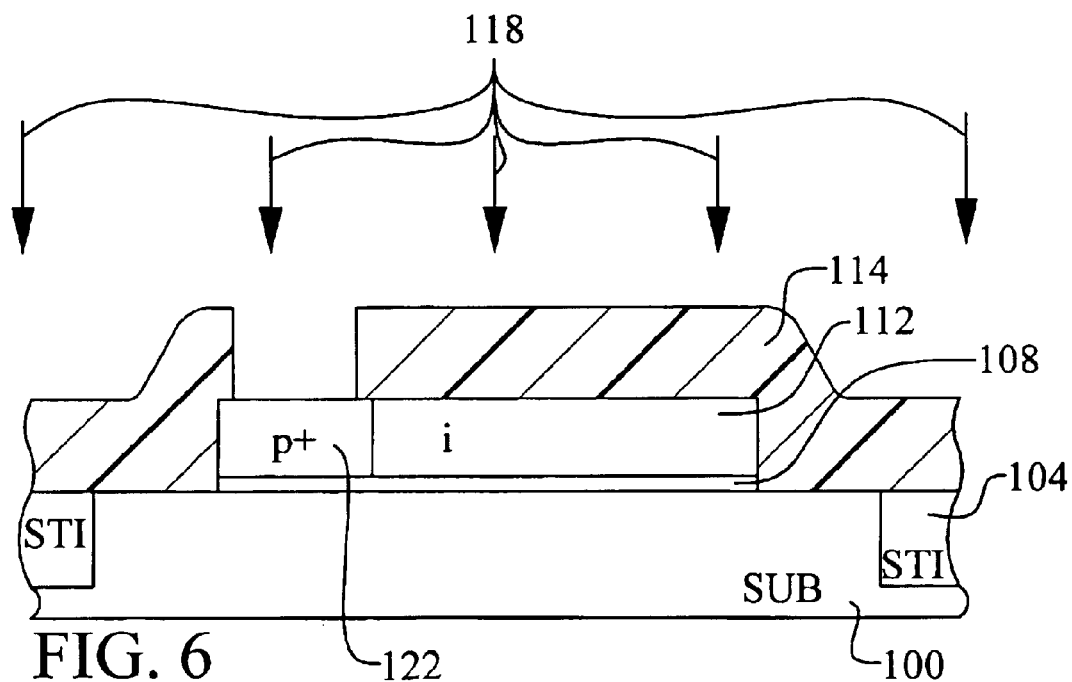

Referring now to FIG. 6, an important feature of the present invention is illustrated. A p+ region 122 is formed in the intrinsic semiconductor layer 112. Preferably, the p+ region 122 is formed by an ion implantation 118. As a preferred method, a masking layer 114 is first defined overlying the semiconductor substrate 100 and the intrinsic semiconductor layer 112. This masking layer 114 may comprise a photosensitive film that is defined as described above. An opening is defined in the masking layer 114 such that ions can be selectively implanted 118 into the intrinsic semiconductor layer 112 to form the p+ region 122 while these ions are blocked from implantation into other parts of the intrinsic semiconductor layer 112 or the semiconductor substrate 100. Most preferably, the p+ region 122 is formed at one end or edge of the patterned intrinsic semiconductor layer 112. Following the formation of the p+ region 122, the masking layer 114 is removed. In one embodiment of this step, the intrinsic semiconductor layer 112 is a polysilicon layer and the ion implantation 118 is used to dope the polysilicon layer in other section of the integrated circuit device. In another embodiment of this step, the ion implantation 118 is used to form source and drain regions in PMOS devices in other sections of the integrated circuit device.

Figure 7:
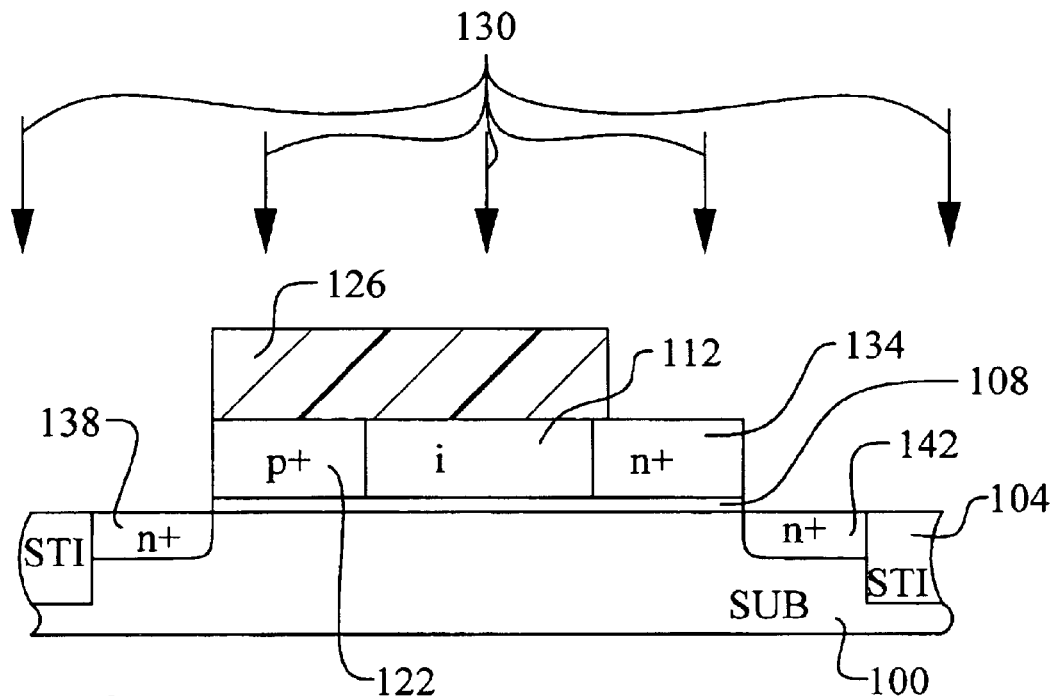

Referring now to FIG. 7, other important features of the present invention are illustrated. An n+ region 134 is formed in the intrinsic semiconductor layer 112. Preferably, the n+ region 134 is formed by an ion implantation 130. As a preferred method, a masking layer 126 is first defined overlying the semiconductor substrate 100, the intrinsic semiconductor layer 112, and the p+ region 122. The n+ region 134 may be formed before or after the p+ region 122, the order is not important to the teachings of the present invention. The masking layer 126 may comprise a photosensitive film that is defined as described above. An opening is defined in the masking layer 126 such that ions can be selectively implanted 130 into the intrinsic semiconductor layer 112 to form the n+ region 134 while these ions are blocked from implantation into other parts of the intrinsic semiconductor layer 112 and the p+ region 122. Most preferably, the n+ region 134 is formed at the end or edge of the patterned intrinsic semiconductor layer 112 opposite from the p+ region 122. Following the formation of the n+ region 134, the masking layer 126 is removed. In one embodiment of this step, the intrinsic semiconductor layer 112 is a polysilicon layer and the ion implantation 130 is used to dope the polysilicon layer in other section of the integrated circuit device. In another embodiment of this step, the ion implantation 130 is used to form source and drain regions in NMOS devices in other sections of the integrated circuit device. In the preferred embodiment shown, the masking layer 126 exposes the semiconductor substrate 100 in areas where source and drain regions for the FET device are planned. Therefore, ions 130 are implanted into the semiconductor substrate 100 and adjacent to the patterned semiconductor layer 112 to form the source region 138 and the drain region 142 of the FET device. The masking layer 126 is removed after this implanting step.

At this point, the novel device of the present invention may be described. The device comprises the dielectric layer 108 overlying the semiconductor substrate 100. A PIN diode device 122, 112, and 134 overlies the dielectric layer 108. The PIN diode device comprises a semiconductor layer having a p+ region 122 and an n+ region 134 that are laterally separated by an intrinsic region 112. A MOSFET device comprises a source region 138 and a drain region 142 in the semiconductor substrate 100. The PIN diode device 122, 112, and 134 is the gate electrode for the MOSFET device. The operation of this novel device is explained below after the final details of the preferred method of manufacture are discussed.

Figure 8:
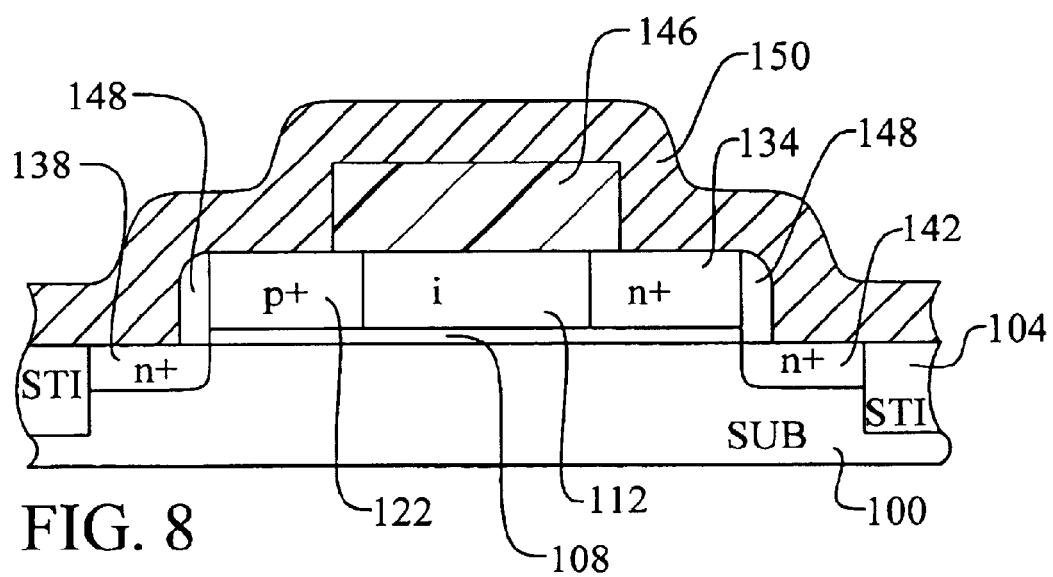

Referring now to FIG. 8, the formation of silicide regions on the device are disclosed. To facilitate the formation of self-aligned, metal silicide (salicide) regions, two additional layers are formed on the device. For example, spacers 148 are formed on the sidewalls of the PIN diode device 122, 112, and 134. The spacers 148 may be formed by a well-known method. First, a dielectric film 148, such as oxide or nitride, is deposited overlying the wafer. Next, this dielectric film 148 is anisotropically etched to remove the film 148 from all horizontal surfaces. If the etch is stopped when the horizontal surfaces have cleared, then part of the film 148 will remain on the vertical surfaces and create the spacers 148 shown. Next, a masking layer 146 is formed overlying the remaining intrinsic region 112 of the PIN diode device. This masking layer 146 may comprise a photosensitive layer, as described above, or may comprise a dielectric layer. In either case, the masking layer 146 is patterned such that the intrinsic region 112 of the PIN diode device is completely covered. A metal layer 150 is next deposited overlying the wafer. Specifically, the metal layer 150 overlies the semiconductor substrate 100, the source region 138, the drain region 142, the spacers 148, the p+ region 122, the n+ region 134, and the masking layer 146. The metal layer 150 comprises a metal that will readily react with the semiconductor substrate 100 and the intrinsic semiconductor layer 112 material. In the preferred embodiment, the semiconductor substrate 100 comprises silicon and the intrinsic semiconductor layer 112 comprises polysilicon. In this case, the metal layer 150 preferably comprises titanium or cobalt.

Figure 9:
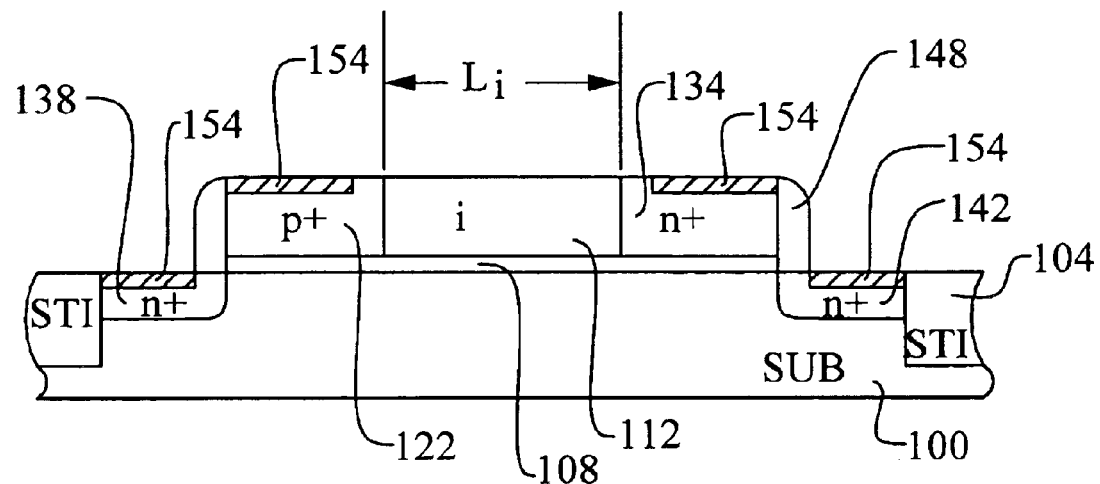

Referring now to FIG. 9, with the metal layer 150 in place, a thermal anneal operation is performed. The thermal anneal increases the reaction rate between the metal 150 and the semiconductor material in contact with the metal. As a result, a significant layer of metal silicide 154 is formed overlying the source region 138, the drain region 142, the p+ region 122, and the n+ region 134. The silicide layer 154 does not form where the metal layer 150 is isolated from the silicon by the dielectric layer 104, the spacers 148, or the masking layer 146. As a result, the silicide layer 154 does not form overlying the intrinsic region 112 of the PIN diode or on the sidewalls of the PIN diode. Following the thermal anneal, the unreacted metal layer 150 is removed, and the masking layer 146 is removed. The resulting metal silicide region 154 reduces the resistance, especially the contact resistance, of the regions where the silicide is formed.

Figure 10:
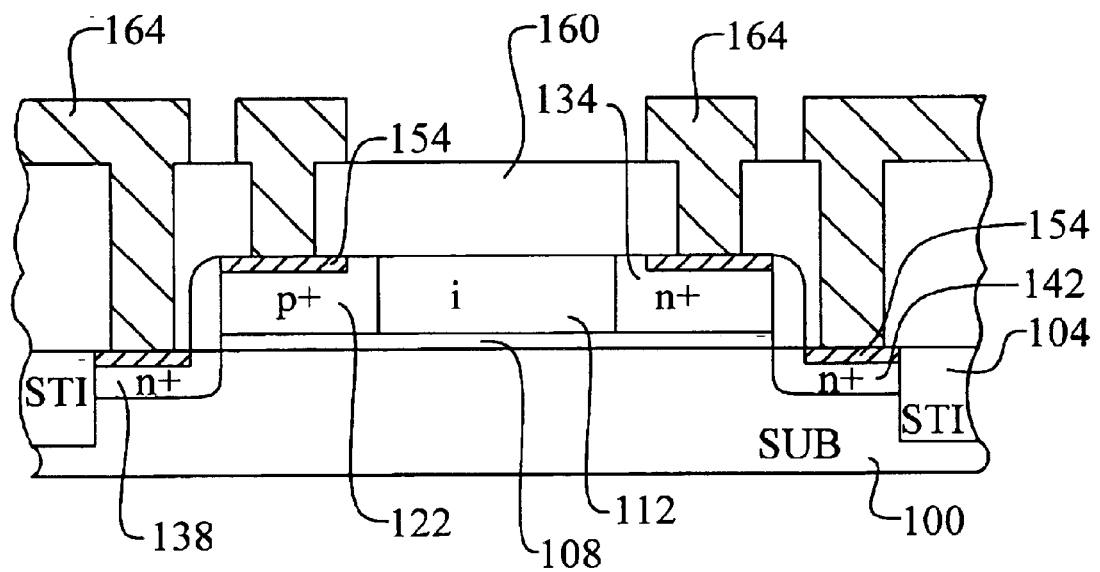

Referring now to FIG. 10, the final form of the novel, PIN diode gate, MOSFET device is illustrated. A passivation layer 160 is deposited overlying the device. This passivation layer 160 comprises a dielectric material, such as silicon nitride, as is well known in the art. Openings are formed in the passivation layer 160 to expose the source region 138, the drain region 142, the p+ region 122, and the n+ region 134. A metal layer 164 is deposited overlying the passivation layer 160 and filling the contact openings. The metal layer 164, such as aluminum, copper, or alloys of aluminum or copper, is then patterned to form interconnect lines. The interconnect lines 164 are used to connect the terminals (source, drain, p+, n+) of the device as needed for circuit operation.

Figure 11:
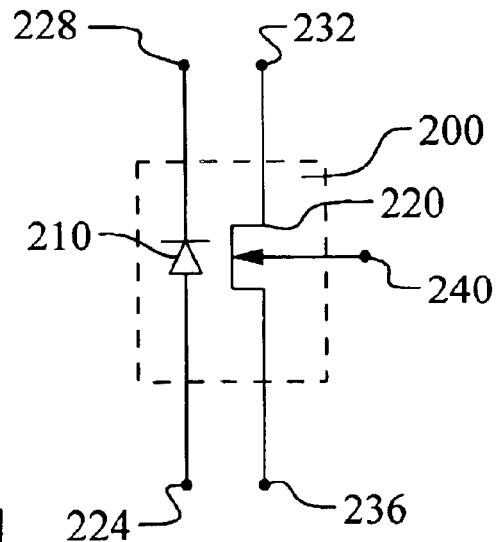
FIG. 11 illustrates a schematic representation of the PIN diode gated, MOSFET device.

Referring now to FIG. 11, the resulting device 200 is illustrated in schematic form. The device 200 can be viewed as a NMOS device 220 where the gate electrode comprises a diode 210. A five terminal device is formed with the diode p+ terminal 224 and n+ terminal 228, and the MOS drain terminal 232, source terminal 236, and bulk terminal 240. More particularly, the diode 210 part of the device 200 comprises a PIN diode device 210. In a PIN diode device, the p+ and n+ regions are separated by a region of intrinsic semiconductor. Referring again to FIG. 10, the present invention forms a lateral, PIN diode device 122, 112, and 134. This PIN diode device also serves as the gate electrode for the MOS device having source region 138, drain region 142, and bulk region 100.

A PIN diode has different electrical properties than a typical diode. PIN diode performance is analyzed in the standard reference by S. M. Sze, *Physics of Semiconductor Devices*, Second Ed, John Wiley & Sons, 1981, pp. 570–577. Of particular importance to the present invention is the performance of the PIN diode during reverse bias conditions. During reverse bias, when the n+ region is biased to a higher voltage than the p+ region, the PIN diode has a uniform electric field across intrinsic region under low, reverse current conditions. Further, the avalanche region ideally corresponds to the full width of the intrinsic region. When the applied reverse voltage is just large enough to cause avalanche breakdown, the reverse current is small. The space-charge effect can be neglected, and the electric field is essentially uniform across the depletion layer. As the current increases, however, more electrons are generated near the p-ι boundary, and more holes are generated near the n-ι boundary by impact ionization as the electric field is double-peaked. These space charges will cause a reduction of the field in the center of the intrinsic region. Thus, the voltage in the center of the intrinsic region is reduced. This reduction results in a negative incremental DC resistance for the PIN diode in the high current mode.

Referring again to FIG. 9, in the present invention, the intrinsic region 112 will be conductivity modulated by carriers from the injecting side (p+ region 122) and will exhibit low resistance during high current injection. The length $L_i$ of the intrinsic region 112 is carefully selected such that it exhibits the desired series resistance between the p+ region 122 and the n+ region 134. In addition, the length $L_i$ of the intrinsic region 112 will effect the secondary breakdown voltage of the PIN diode device 122, 112, and 134. It is found that the second breakdown voltage of the PIN diode decreases as the length $L_I$ is decreased.

By constructing a PIN diode device 122, 112, and 134, such that it is also the gate of the MOSFET device, a unique device is created. It is possible to control the channel region between the source region 138 and the drain region 142 of the MOSFET by biasing the PIN diode. Likewise, the PIN diode itself is an active device. The characteristics of this unique device are best utilized when applied to the problem of ESD protection.

Figure 12:
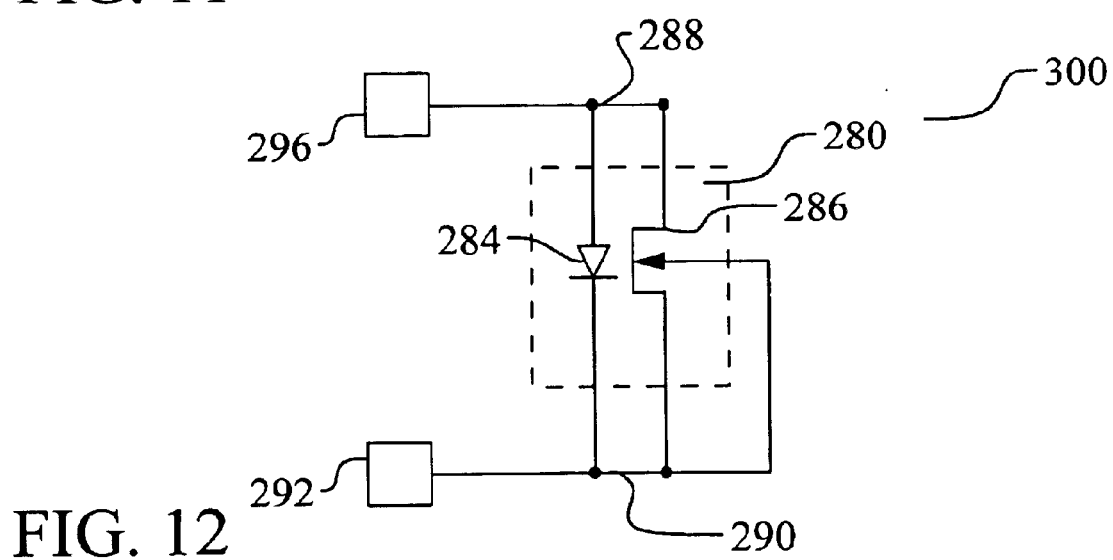
FIG. 12 illustrates a first preferred embodiment of an ESD protection device comprising the PIN diode gated, MOSFET device.

Referring now to FIG. 12, a first preferred embodiment of an ESD protection device 300 of the present invention is illustrated. This device 300 comprises the PIN diode gate, MOSFET device 280 described above. In particular, an NMOS transistor 286 has a gate comprising a PIN diode 284. The source region of the NMOS 286 and the n+ region of the PIN diode 284 are connected together to form a first terminal 290. The drain region of the NMOS 286 and the p+ region of the PIN diode 284 are connected together to form a second terminal 288. The first terminal 290 is preferably further connected to the ground pin or pad 292 of the circuit, and the second terminal 288 is preferably further connected to an input pin or pad 296 of the circuit.

In this configuration, the PIN diode 284 is the primary protection device. The NMOS device 286 is configured in a means similar to a grounded gate NMOS. The NMOS device 286 is the secondary protection device. Essentially, the PIN diode device 284 is electrically in parallel with the grounded gate NMOS device 286. During an ESD event, a large voltage pulse is applied to the input pin 296. When an ESD pulse is applied to the top terminal 296. The PIN diode 284 turns ON at the gate. As the potential drop across the diode 284 increases, at some point the transistor 286, which is initially OFF, goes into avalanche breakdown and the parasitic bipolar turns ON to shunt all the current. Thus, this device combines a secondary device, the PIN diode 284, and a primary device, the NMOS transistor 286, in one compact layout. Therefore, the PIN diode 284 performs two functions: shunting ESD current and providing a gate bias to reduce the parasitic n-p-n turn-ON voltage of the GGNMOS 286. This is a two-stage protection device where the PIN diode 284 and the GGNMOS 286 are parallel protection devices.

Figure 14:
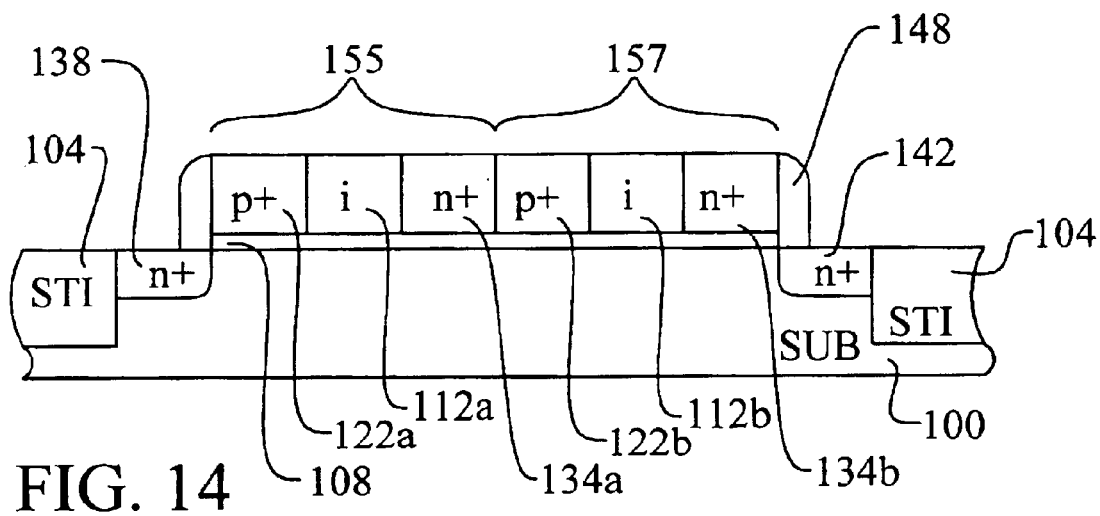
FIGS. 14 through 16 illustrate a third preferred embodiment of the ESD protection device of the present invention.
Figure 15:
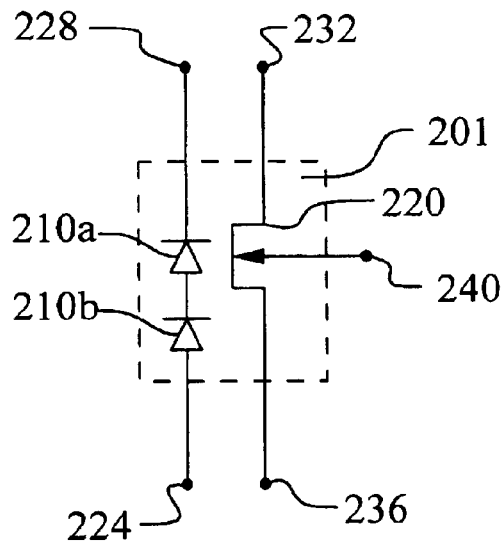
Figure 16:
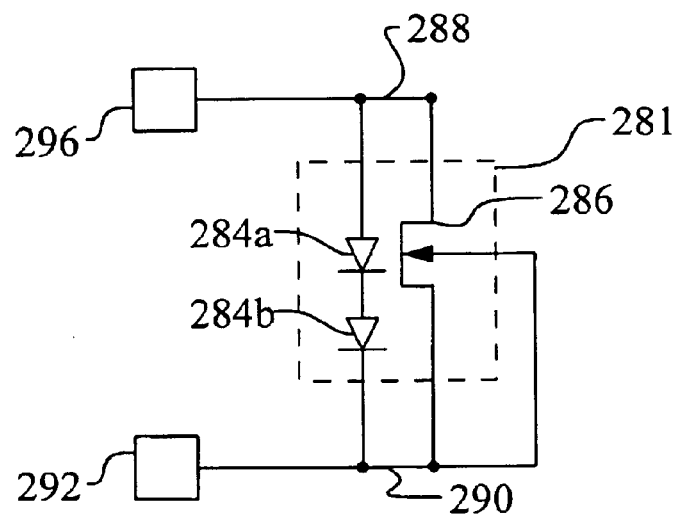

Note that the PIN diode 284 is arranged such that the input terminal 296 can only swing about a diode above the ground terminal 292 before the PIN diode 284 begins to conduct. This limits the input signal range. Alternatively, to increase the input signal swing, several PIN diodes may be used in series. Referring now to FIGS. 14 through 16, an ESD device is shown where several PIN diodes are formed in series. In particular, FIG. 14 shows the cross section of the device. Note that the gate comprises two PIN diodes 155 and 157. The first PIN diode 155 comprises a p+ 122a, an n+ 134a, and an intrinsic region 112a. The second PIN diode 157 comprises a p+ 122b, an n+ 134b, and an intrinsic region 112b. Referring now to FIG. 15, the multiple PIN diode device 201 is shown in schematic form. In this case, two PIN diodes 210a and 210b form the gate for the MOSFET 220. Referring now to FIG. 16, the device 281 is applied for ESD protection between the input pin 296 and the ground pin 292. The series PIN diodes 284a and 284b cause the turn ON voltage of the resulting ESD protection device 281 to be increased. As a result, the signal on the input pad 296 can swing to a larger voltage with respect to the ground pad 292 without being clamped. The concept can be easily extended to three or more PIN diodes in the gate.

Figure 13:
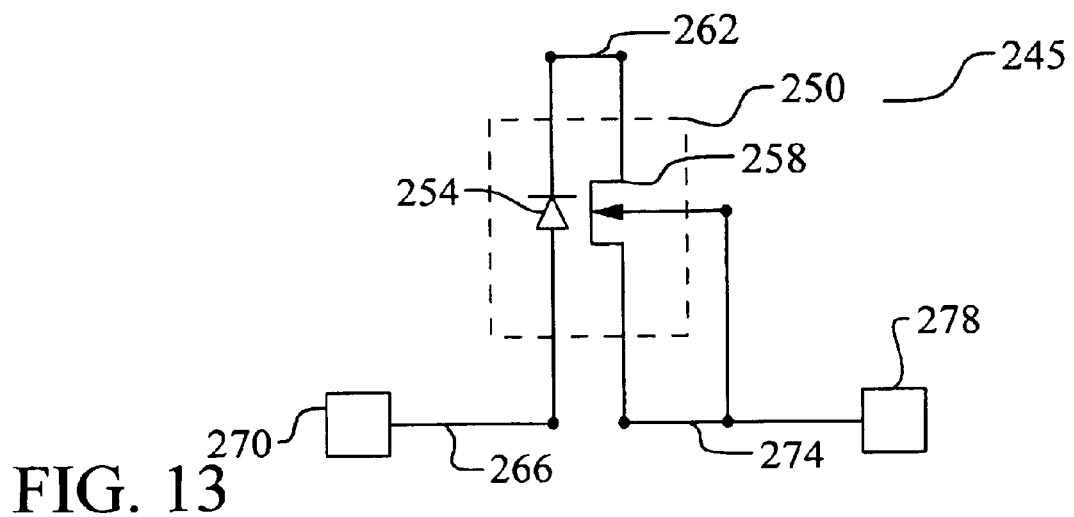
FIG. 13 illustrates a second preferred embodiment of an ESD protection device comprising the PIN diode gated, MOSFET device.

Referring now to FIG. 13, a second preferred embodiment of an ESD protection device 245 of the present invention is illustrated. In this case, the p+ region of the PIN diode device 254 is a first terminal 266. The drain region of the NMOS device 258 and the n+ region of the PIN diode device 254 are connected together at a middle node 262. The source region of the NMOS device 258 forms a second terminal 274. It is further preferred that the first terminal 266 be connected to the input pin 270 and that the second terminal 274 be connected to an grounded pin 278.

In this embodiment, the PIN diode device 254 and the parasitic bipolar (n-p-n) device of the GGNMOS 258 are connected in series between the two terminals 266 and 274. During an ESD event, the gate potential of the GGNMOS 258 is increased due to the voltage drop across the PIN diode 254, and the avalanche breakdown voltage ($V_{T1}$) of the parasitic bipolar device (n-p-n) of the GGNMOS is decreased by this gate potential. An ESD pulse is applied to the input terminal 270 while the ground terminal 278 is grounded. The PIN diode 254 is in series with the NMOS-FET device 256. The potential drop across the PIN diode 254 helps to turn ON the MOSFET 256 channel slightly to cause the parasitic bipolar of the MOSFET to turn ON easier. In either the first or second embodiments, a negative voltage potential on the input terminals will cause the substrate diode to turn ON. The novel ESD devices of the present invention are useful for positive ESD spikes.

The above-described ESD devices of the first and second embodiments provide excellent ESD protection for input pins of integrated circuit devices. These devices provide larger current shunting capability without increasing the parasitic capacitance or the area requirements. The PIN diode gate is achieved without adding to the process complexity.

Additional embodiments of the present invention are illustrated in FIGS. 14 through 16. FIG. 14 illustrates a PIN gated device of the present invention wherein multiple PIN diodes are formed. In this case, a first PIN diode 155 is formed by the p+ region 122a, the intrinsic region 112a, and the n+ region 134a. A second PIN diode 157 is formed by the p+ region 122b, the intrinsic region 112b, and the n+ region 134b. Referring now to FIG. 15, a schematic version of the two PIN diode device 201 is shown. The device comprises sequential PIN diodes 210a and 210b formed in the gate of a MOS device 220. FIG. 16 illustrates this two PIN device used as an ESD protection structure between pads 296 and 292.

The advantages of the present invention may now be summarized. An effective and very manufacturable integrated circuit device is provided. The integrated circuit device is useful for protecting an input pin from an ESD event. The device provides excellent ESD performance in a state of the art CMOS process without requiring a large area or adding excessive parasitic capacitance. The device can be used in multiple configurations. A method to form such a device is achieved. The method is very manufacturable and is compatible with a state of the art CMOS process.

As shown in the preferred embodiments, the novel device and method of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form an integrated circuit device comprising:
    forming a dielectric layer overlying a semiconductor substrate;
    forming an intrinsic semiconductor layer overlying said dielectric layer;
    patterning said intrinsic semiconductor layer;
    forming a p+ region in said intrinsic semiconductor layer;
    forming an n+ region in said intrinsic semiconductor layer wherein said p+ region and said n+ region are laterally separated by an intrinsic region to thereby form a PIN diode device; and
    forming a source region and a drain region in said semiconductor substrate to thereby complete a MOSFET device wherein said PIN diode device is a gate electrode for said MOSFET device.

2. The method according to claim 1 wherein said dielectric layer comprises an oxide.

3. The method according to claim 1 wherein said semiconductor layer comprises polysilicon.

4. The method according to claim 1 wherein said semiconductor layer comprises amorphous silicon.

5. The method according to claim 1 wherein step of forming said p+ region comprises implanting ions and wherein a masking layer is used to control where said ions are implanted.

6. The method according to claim 1 wherein said step of forming said n+ region comprises implanting ions and wherein a masking layer is used to control where said ions are implanted.

7. The method according to claim 6 wherein said step of forming said source and drain regions comprises implanting ions and wherein said step is simultaneous with said step of forming said n+ region.

8. The method according to claim 1 further comprising:
    forming spacers on the sidewalls of said PIN diode device;
    forming a masking layer covering said intrinsic region while exposing said p+ region, said n+ region, said source region, and said drain region;
    depositing a metal layer overlying said source region, drain region, said n+ region, said p+ regions, said spacers, and said masking layer;
    annealing said metal layer to form metal silicide regions overlying said source region, said drain region, said n+ region, and said p+ region; and
    removing unreacted said metal layer.

9. The method according to claim 1 wherein said drain region and said p+ region are connected together to form a first terminal and wherein said source region and said n+ region are connected together to form a second terminal.

10. The method according to claim 9 wherein said first terminal is connected to a signal pad and said second terminal is connected to a ground pad.

11. The method according to claim 1 wherein said p+ region is a first terminal, wherein said drain region and said n+ region are connected together, and wherein said source region forms a second terminal.

12. The method according to claim 11 wherein said first terminal is connected to a signal pad and said second terminal is connected to a ground pad.

13. An integrated circuit device comprising:
    a dielectric layer overlying a semiconductor substrate;
    a PIN diode device overlying said dielectric layer wherein said PIN diode device comprises a semiconductor layer having a p+ region and an n+ region that are laterally separated by an intrinsic region; and
    a MOSFET device comprising a source region and a drain region in said semiconductor substrate wherein said PIN diode device is a gate electrode for said MOSFET device.

14. The device according to claim 13 wherein said dielectric layer comprises an oxide.

15. The device according to claim 13 wherein said semiconductor layer comprises polysilicon.

16. The device according to claim 13 further comprising:
    spacers on the sidewalls of said PIN diode device; and metal silicide regions overlying said source region, said drain region, said n+ region, and said p+ region.

17. The device according to claim 13 wherein said drain region and said p+ region are connected together to form a first terminal and wherein said source region and said n+ region are connected together to form a second terminal.

18. The device according to claim 17 wherein said first terminal is connected to a signal pad and said second terminal is connected to a ground pad.

19. The device according to claim 13 wherein said p+ region is a first terminal, wherein said drain region and said n+ region are connected together, and wherein said source region forms a second terminal.

20. The device according to claim 19 wherein said first terminal is connected to a signal pad and said second terminal is connected to a ground pad.

21. An ESD protection device comprising:

a dielectric layer overlying a semiconductor substrate;

a PIN diode device overlying said dielectric layer wherein said PIN diode device comprises a semiconductor layer having a p+ region and an n+ region that are laterally separated by an intrinsic region; and a MOSFET device comprising a source region and a drain region in said semiconductor substrate, wherein said PIN diode device is a gate electrode for said MOSFET device, wherein said drain region and said p+ region are connected together to form a first terminal, and wherein said source region and said n+ region are connected together to form a second terminal.

22. The device according to claim 21 wherein said dielectric layer comprises an oxide.

23. The device according to claim 21 wherein said semiconductor layer comprises polysilicon.

24. The device according to claim 21 further comprising:

spacers on the sidewalls of said PIN diode device; and metal silicide regions overlying said source region, said drain region, said n+ region, and said p+ region.

25. The device according to claim 24 wherein said first terminal is connected to a signal pad and said second terminal is connected to a ground pad.

26. An ESD protection device comprising:

a dielectric layer overlying a semiconductor substrate;

a PIN diode device overlying said dielectric layer wherein said PIN diode device comprises a semiconductor layer having a p+ region and an n+ region that are laterally separated by an intrinsic region; and a MOSFET device comprising a source region and a drain region in said semiconductor substrate, wherein said PIN diode device is a gate electrode for said MOSFET device, wherein said p+ region forms a first terminal, wherein said drain region and said n+ region are connected together, and wherein said source regions forms a second terminal.

27. The device according to claim 26 wherein said dielectric layer comprises an oxide.

28. The device according to claim 26 wherein said semiconductor layer comprises polysilicon.

29. The device according to claim 26 further comprising:

spacers on the sidewalls of said PIN diode device; and metal silicide regions overlying said source region, said drain region, said n+ region, and said p+ region.

30. The device according to claim 26 wherein said first terminal is connected a signal pad and said second terminal is connected to a ground pad.

31. An ESD protection device comprising:

a dielectric layer overlying a semiconductor substrate;

a plurality of PIN diode devices overlying said dielectric layer wherein each said PIN diode device comprises a semiconductor layer having a p+ region and an n+ region that are laterally separated by an intrinsic region and wherein said PIN diode devices are in series; and a MOSFET device comprising a source region and a drain region in said semiconductor substrate, wherein said PIN diode device is a gate electrode for said MOSFET device, wherein said drain region and said p+ of a first said PIN diode device are connected together to form a first terminal, and wherein said source region and said n+ region of a second said PIN diode device are connected together to form a second terminal.

32. The device according to claim 31 further comprising:

spacers on the sidewalls of said PIN diode device; and metal silicide regions overlying said source region, said drain region, said n+ region, and said p+ region.

33. The device according to claim 31 wherein said first terminal is connected to a signal pad and said second terminal is connected to a ground pad.

* * * * *